United States Patent
Levashov et al.

(10) Patent No.: US 9,663,851 B2
(45) Date of Patent: May 30, 2017

(54) SUBSTRATE FOR CVD DEPOSITION OF DIAMOND AND METHOD FOR THE PREPARATION THEREOF

(75) Inventors: Evgeny A. Levashov, Moscow (RU); Ekaterina V. Azarova, Moscow (RU); Victor G. Ralchenko, Moscow (RU); Andrey Bol'Shakov, Moscow (RU); Evgeny E. Ashkinazi, Moscow (RU); Hiroshi Ishizuka, Tokyo (JP); Satoru Hosomi, Oyama (JP)

(73) Assignees: Tomei Diamond Co., Ltd., Tokyo (JP); National University of Science and Technology "MISIS", Moscow (RU); General Physics Institute of Russian Academy of Science, Moscow (RU)

( * ) Notice: Subject to any disclaimer, the term of this patent is extended or adjusted under 35 U.S.C. 154(b) by 790 days.

(21) Appl. No.: 13/884,369

(22) PCT Filed: Nov. 9, 2010

(86) PCT No.: PCT/JP2010/069888
§ 371 (c)(1),
(2), (4) Date: May 23, 2013

(87) PCT Pub. No.: WO2012/063318
PCT Pub. Date: May 18, 2012

(65) Prior Publication Data
US 2013/0230715 A1    Sep. 5, 2013

(51) Int. Cl.
| | | |
|---|---|---|
| *C23C 4/12* | (2016.01) | |
| *C23C 4/06* | (2016.01) | |
| *C23C 16/27* | (2006.01) | |
| *C23C 4/131* | (2016.01) | |
| *C23C 10/28* | (2006.01) | |
| *C23C 16/02* | (2006.01) | |
| *C23C 4/10* | (2016.01) | |
| *C23C 4/18* | (2006.01) | |
| *C23C 4/067* | (2016.01) | |

(52) U.S. Cl.
CPC ............ *C23C 4/131* (2016.01); *C23C 4/067* (2016.01); *C23C 4/10* (2013.01); *C23C 4/18* (2013.01); *C23C 10/28* (2013.01); *C23C 16/0272* (2013.01); *C23C 16/271* (2013.01); *Y10T 428/25* (2015.01)

(58) Field of Classification Search
CPC ........... C23C 4/131; C23C 4/067; C23C 4/18; C23C 4/10; C23C 16/271; C23C 16/0272; C23C 10/28; B22F 1/0003; B22F 2207/03
See application file for complete search history.

(56) References Cited

U.S. PATENT DOCUMENTS

| | | | |
|---|---|---|---|
| 6,203,897 B1 * | 3/2001 | Koizumi et al. | 428/336 |
| 6,336,950 B1 * | 1/2002 | Koizumi | C23C 26/00 219/76.13 |
| 2006/0169596 A1 * | 8/2006 | Goto | C23C 26/00 205/640 |

FOREIGN PATENT DOCUMENTS

| | | |
|---|---|---|
| JP | H06-276596 A | 9/1994 |
| JP | H10-022563 A | 1/1998 |
| JP | H11-106948 A | 4/1999 |
| JP | H11-193479 A | 7/1999 |
| JP | 2009-090398 A | 4/2009 |

OTHER PUBLICATIONS

International Search Report for PCT/JP2010/069888, ISA/JP, mailed Dec. 7, 1010.

* cited by examiner

*Primary Examiner* — Dah-Wei D Yuan
*Assistant Examiner* — Jose Hernandez-Diaz
(74) *Attorney, Agent, or Firm* — Harness Dickey & Pierce, PLC

(57) ABSTRACT

A substrate for depositing diamond by CVD, comprising a base body of hard material and a coating layer that holds diamond particles as seed crystal in a matrix and is deposited joined thereto on a surface of said base body, wherein:
  the seed diamond particles have an average particle size of 1 μm or smaller;
  the matrix comprises a first metal selected from a first group of Si, Ti, Zr, Hf, V, Nb, Ta, Cr, Mo and W and/or a first compound between said first metal and a non-metallic substance selected from boron, carbon and nitrogen, said matrix holding the diamond particles distributed therein; and
  a joint zone developed as a result of a diffusion process and extending over said base body and coating layer comprises either or both atoms of said first metal and a component metal of the hard material.

10 Claims, 1 Drawing Sheet

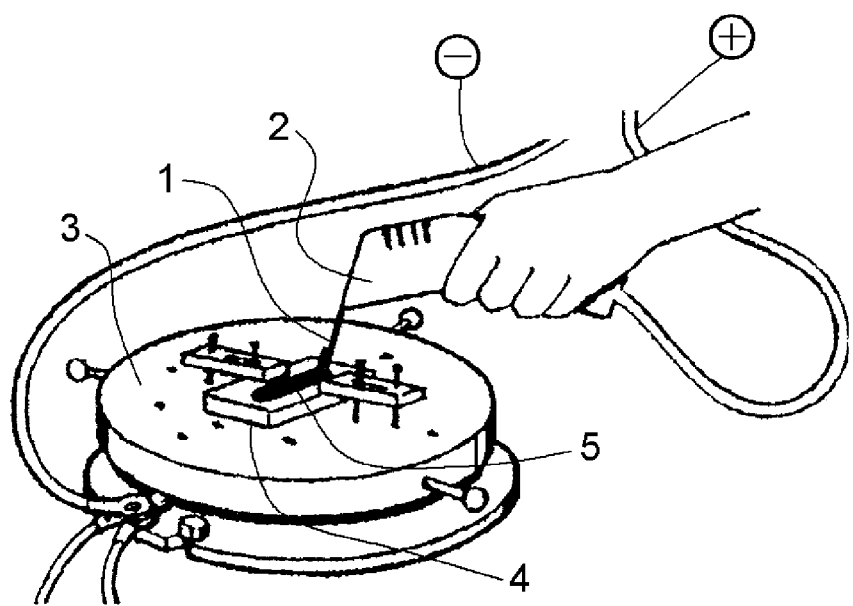

SUBSTRATE FOR CVD DEPOSITION OF DIAMOND AND METHOD FOR THE PREPARATION THEREOF

CROSS-REFERENCE TO RELATED APPLICATIONS

This application is a 371 U.S. National Stage of International Application No. PCT/JP2010/069888, filed Nov. 9, 2010, the entire disclosure of which application is incorporated herein by reference.

TECHNICAL FIELD

The present invention is related to a substrate effectively applicable, in particular, to the formation of diamond coating layer thereon by chemical vapor deposition (CVD). The invention is also related to a method for preparing a deposited surface on such a substrate.

BACKGROUND ART

There are abrasive tools and wear resistant parts that utilize diamond for its characteristic excellent hardness, heat conductivity, friction coefficient, etc. and that contribute to the improvement of productivity in many sectors of industry. Diamond in itself, with a high hardness that makes mechanical work very difficult, is favorably applied as a thin coating just to the work surface, where such properties are needed, of a ready base body with the shape finished.

High quality diamond film is prepared by plasma CVD. With hetero-epitaxial growth processes silicon has been mainly used as a substrate material, and molybdenum and platinum have also been used in a minor part. With such substrate materials, homo-epitaxial processes are also conducted for producing, by increasing the nucleation density, a dense and smooth deposit on diamond particles that are distributed in advance on the substrate as growth origins, instead of just relying upon the spontaneous nucleation.

With tungsten carbide alloys and some alloy steels that are favored materials for abrasive tools, on the other hand, it is considered to be impossible to deposit diamond layer directly on the surface thereof: carbon has a high diffusion tendency into cobalt and other iron group metals, which are contained in the material, and further carbon takes a graphite structure to become stabilized when present in contact with an iron group metal at high temperatures at atmospheric pressure, so no diamond particles can subsist in a CVD process if provided as growth origins in advance.

Thus conventional techniques require cobalt removal in advance from the surface of tungsten carbide alloy substrate, so as to prevent contact of diamond to be deposited with the iron group metal and thereby minimizing conversion to graphite during the process at a high temperature. Such step however inevitably decreases the substrate strength resulting from loss in cobalt bond material, failing to achieve the designed performance of the substrate.

SUMMARY OF INVENTION

The Problem to be Solved by the Invention

Therefore one of the objects of the present invention is to provide a substrate technique for diamond deposition that is eliminated of the above described problems, such that diamond layer can be deposited on any of various tool materials including tungsten carbide alloy and structure part materials that contain iron group metals, without being affected by base body material components.

Means for Solving the Problem

The Inventors have successfully formed a diamond deposit without being affected by any substrate material, by having formed an intermediate layer that is composed basically of ceramic substance or intermetallic compound. The layer is provided in intimate contact with the base body and, further, contains diamond particles as growth origins that are distributed in the layer and separated from the substrate or base body.

The present invention substantially consists in a substrate for depositing diamond by CVD, comprising a base body of hard material and a coating layer that holds diamond particles as seed crystal in a matrix and is deposited and joined thereto partly on a surface of said base body, wherein (1) said seed diamond particles have an average particle size of 1 μm or smaller; (2) said matrix comprises a first metal selected from a first group of Si, Ti, Zr, Hf, V, Nb, Ta, Cr, Mo and W and/or a first compound between said first metal and a non-metallic substance selected from boron, carbon and nitrogen, said matrix holding the diamond particles distributed therein; (3) a joint zone developed as a result of a diffusion process and extending over said base body and coating layer, said zone comprising either or both atoms of said first metal and a component metal of the hard material.

In the description above, the term "base body" is used to refer to a solid object on which a diamond layer is to be deposited by CVD, while a "base part body" to such object when shaped in a certain form for use as a construction part etc.; a "(deposition) substrate" refers to such composite as a whole composed of a base body or base part body that has on the surface a deposit formed thereon and containing seed particles therein.

Such substrate can be effectively prepared according to the invention by a method comprising: (1) depositing a surface of substrate of hard material with a matrix layer that comprises a first metal selected from a first group of Si, Ti, Zr, Hf, V, Nb, Ta, Cr, Mo and W, and/or a first compound between said first metal and a non-metallic substance selected from boron, carbon and nitrogen; (2) placing in distribution diamond particles over a surface of said base body; and (3) securing to hold said diamond particles in and with the matrix comprising said metal and/or said first compound, wherein (4) at least one of the steps 1-3 is conducted under the effect of heat, such that a diffusion of atoms of said first metal and/or a component metal of said hard material is caused to proceed between the layers of matrix and base body from one to the other in either direction and thereby a joint zone is formed to extend over said matrix and said base, with which the both layers are joined.

By the present invention the matrix material firmly holds to fix diamond particles and at the same time is firmly joined to the base body as a result of diffusion process that occurs between the matrix and base body. Diamond growth takes place on diamond particles contained as a growth origin in the matrix, so a smooth diamond layer can be formed without being affected by the base body material and, in short, on a body of tungsten carbide alloy or stainless steel, which have been heretofore not available for the purpose.

Base body materials can be selected as needed for specific applications. For example, a cobalt-rich tungsten carbide alloy may be used for grinding tools to be used under heavy impulsive loading, while stainless steels can be used for large structural parts to which high wear resistance is essential, and copper for uses where both wear resistance and heat dissipation are required. With any kind of material a sound diamond layer can be prepared because it grows effectively in isolation from the base body material by an intermediate layer that does not accelerate graphitization of diamond.

Base body parts are available as formed in advance to an intended end shape, such that the labor or time for a subsequent process may be effectively saved that would be otherwise necessary for finishing the resulting diamond deposited composite. Further wear resistant parts can be prepared in wide ranging sizes and shapes.

For the manufacture of an abrasive tool common carbide alloys basically composed of WC and Co as a base body material. Also diamond layer can be deposited on a base body of iron-group metal, such as SUS and other grade stainless steels. In those cases the use as an intermediate layer component of a material that has a thermal expansion property between diamond and the base body material (such as carbides or nitrides) may be effective for preventing troubles which would be caused by possible detachment or loosening apart of diamond deposit under high temperatures during the diamond deposition or in the use as a tool.

In the present invention diamond particles to be distributed in the matrix may be a crushed diamond powder product from a static ultrahigh pressure synthesis process. The particles work as good growth origins for: they are a pulverized mass of minute fractured single crystals, broken mainly by cleavage or caused at crystal deficiencies where the structure is incomplete, so that resulting particles have good crystal quality, with a limited number of layers of foreign atoms or functional group covering the surface. Further they contain just a minimum level of impurity, as having been chemically removed from the diamond in the refinement processes subsequent to the crushing. Therefore, the diamond of this type has a preferable function as growth origins.

Detonation type diamond particles may be also used as growth origins. Although they are in primary or non-agglomerated state particles with a size of 10 nm or less, they firmly collect in dry state to form secondary particles of an apparent size of 100 nm or more, so disintegration may be necessary before use to the size of primary state. This type of diamond is not very good in crystal quality with rather a high level of internal deficiency and, in addition, incomplete surface structure, as a product of dynamic ultrahigh pressure process by detonation that gives a limited time for synthesis.

Distributed in the matrix for use as diamond layer growth origins, it is preferable that the diamond particles have a submicron average particle size, that is 1 µm or less, and a nanometer particle size of or less than 0.1 µm when a smoother deposit is intended.

The diamond concentration in the intermediate layer should preferably be 1 to 40% relative to the mass of matrix, all combined. A diamond content less than 1% may cause, with an insufficient number of origins, difficulty in forming dense and smooth deposit layer with a uniform thickness, while at a high content over 40% an insufficient hold may result for the diamond particles by the matrix, leading eventually to detachment of the deposit.

For effectively depositing a dense and smooth layer, the diamond particles, which work normally as growth origins, should be such a size-sorted grade with narrow ranging particle sizes that the accumulated size distribution can be characterized by ratios of $D_{10}$ and $D_{90}$ parameters to occasional $D_{50}$ median particle size as 0.6 or more and 1.6 or less, respectively.

Diamond powder products often have an oxygen-containing functional group or more on the particle surface as a result of their contact with water in the course of production steps. As far as the diamond growth is concerned, there is no need for minding the surface condition of diamond particles to be used, since the functional groups are removed and replaced by hydrogen atoms that terminate the diamond surface when treated in hydrogen plasma for diamond growth process by CVD. It is preferable, however, that in the preceding process the diamond particles have a hydrogen terminated surface provided in advance, for the purpose of both improving the contact of growth origins with the intermediate layer matrix material (distribution material), and also for preventing possible oxidation or graphitization of diamond during the process of intermediate layer deposition.

For the preparation of an intermediate layer, starting compositions to be used may contain a transition metal (or group IV, V or VI metal of the Periodic Table) composed together or matched with a specific non-metallic substance as to form corresponding carbide, nitride or boride. Those compounds can be melted and bonded to the base body by heat to be yielded in their formation. Further some intermetallic compounds may be added to the starting composition.

Thus the starting compositions may contain, as matrix materials mixed with diamond particles, powder of a metal selected from Si, Ti, Zr, Hf, V, Nb, Ta, Cr, Mo, and W, and non-metallic substance of boron or carbon, for the formation of carbide or boride by reaction within the ingredients, or with nitrogen for the formation of nitride by conducting the layer deposition in nitrogen atmosphere. Also those metals and non-metallic substances may be contained in the matrix material in combination, for each, as a mixed powder for the formation in mix of such compounds. Boron nitride is available as a source of both boron and nitrogen.

The intermediate layer of the invention, as prepared above, may use various combinations for composing the intermediate layer. Using titanium metal as a favorable basic material, components forming the intermediate layer may include combinations of the single metal and non-metallic substances of TiB, TiC, TiN, TiCN, Ti—B—N and Ti—B—C. Further combinations of several metals and non-metallic substance(s) are available, such as: Ti—Al—C, Ti—Cr—C, Ti—Si—C, Ti—Ta—C, Ti—Mo—C, Ti—W—C, Ti—Al—W—C, Ti—Cr—Ni—C, Ti—Al—Ni—C, Ti—Al—B, Ti—Cr—B, Ti—Mo—B, Ti—Al—N, Ti—Si—N, Ti—Al—Si—N, Ti—Al—B—N, Ti—Cr—B—N, Ti—Al—Si—B—N, and Ti—Si—B—C—N. In the list above the substitution for Ti of another transition metal, including Cr, Ta, V, Nb, Mo or W is possible, which provides Cr—B, Cr—Al—N, and Cr—B—N, for example.

Among the list described above ingredients Si, Al and Ni are considered to work effective for the formation of intermetallic compound, or as a relatively low melting component that diffuses and melts for creating a firm joint of the diamond layer by way of the intermediate layer to the base material. While nickel in itself is known to accelerate the conversion of diamond to graphite, it is also recognized that it remains not harmful to diamond so far as contained less than several percent. In this sense a small proportion of nickel may be added, as well as silicon and aluminum, when a certain amount of intermetallic compound with transition metal is desired in the matrix.

Also particles of preformed carbide or nitride, such as WC, TiC, TaC, $Cr_3C_2$, TiN, and TaN, may be added to the starting material composition described above.

While many powders and ultrafine powders of the substances may be used as in their commercially available conditions for preparing the starting compositions, such mechanical alloying or activation pre-treatment using a planetary mill for example is found effective for lowering the combustion temperature and thereby suppressing the conversion of diamond to graphite or decreasing the strain to occur in the deposit layer.

In the formation of intermediate layer, there should occur chemical bonding between the layer matrix and base body under it, so that the diamond particles in the matrix be joined firmly by way of the intermediate layer to the base body. For this purpose the diamond-containing intermediate layer in the present invention is heated in the formation, so as to promote the bonding of the base body and intermediate layer being made.

For example matrix components for securing diamond may be first deposited on the base body surface, and then the whole is heated so as to cause a mutual diffusion between matrix components and base body materials, or to allow a component of the base body material to melt and infiltrate into the matrix components.

As one of the most effective techniques for the bonding is available welding, or transfer in molten or half-molten particles of coating materials onto the surface of a base body. Short lasting intensive heating techniques available for this process include certain types of discharge, such as electro-spark discharge (ESD) or electro-spark alloying (ESA) and arc discharge, which can avoid deterioration of diamond contained due to the low power input, as well as hot spray technique that enables a large area of layer deposition. Techniques based on either discharge or hot spray yield over a limited area a high temperature over 2000° C. that lasts for a short time, such that, it has been confirmed, the deposit formation completes within the induction time for graphitization of diamond. Formation of a diamond containing layer by ESD is known to public.

PRIOR ART DOCUMENTS

Patent Documents

JP-1999106948-A1

BRIEF DESCRIPTION OF THE DRAWING

The invention will be described below in detail with reference to the accompanying drawing.

FIG. 1 shows an illustration of an arrangement for an electro-spark discharge or electro-spark alloying process that is applicable to execute the present invention.

According to ESD or ESA, a consumable electrode rod (anode) 1, made of press-formed materials to be deposited, is held on a holder 2 as shown in FIG. 1 for example, while a work (base body) 4 is fixed on a work table 3 or like and connected as a cathode to a power source (not shown). Then a small discharge is caused to occur over the cathode and anode to transfer in molten particles coating layer materials (used as consumable electrode components), which deposit in molten state on the base body surface to form a coating layer 5. The power input is given in small pulse oscillation of hundreds of Hz, for example, over the electrode tip and cathode surface, in order to produce an intermittent discharge in pulses that each lasts for microseconds, and thereby to minimize the discharge energy that increases the temperature of the deposited layer.

In the present invention it is preferable that the ESD (or ESA) for the deposition of a diamond containing intermediate layer is operated with a power input E (in Joule) for a single pulse of discharge of $0.01 \leq E(J) \leq 10$. A power input less than 0.01 Joule is insufficient for melting or softening the deposition materials, while a power input over 10 Joules is found unfavorable as causing remarkable graphitization under excessive heating to result. For an overall deposition process the parameters of total number of pulses (N) and frequency of pulsating current (f in Hz) is adequate as used in combination within corresponding ranges: $500 \leq N \leq 5400000$ and $0.0185 \leq f/N \leq 0.1$.

For the formation of an intermediate layer containing diamond in a carbide matrix, a starting composition may be used that contains a transition metal, while diamond may be used as the carbon source. For example, diamond is mixed with powder of metal, such as titanium and tungsten, in an amount over stoichiometry for forming corresponding carbide, so that an intermediate layer is obtained with the diamond particles firmly held in a carbide mass deriving from the diamond around it. With this a composite can be prepared that has a coating of grown diamond originating from diamond particles contained in the carbide layer, having formed on and over a base body of tungsten carbide alloy, which retains its physical properties undamaged. This technique can also utilize additional heating provided by carbide formation for providing the high temperature condition.

CVD and PVD techniques are available for securing the diamond particles. Here in a case where a base body or base part contains a metal that has a tendency to accelerate graphitization of diamond, an undercoating of preformed ceramic or ceramic forming metallic ingredients is first formed by CVD or PVD, over which diamond particles are scattered, a layer of ceramic forming metal is deposited and then heated, so that the diamond particles are fixed in the ceramic layer and, at the same time, the ceramic layer and base body are joined by means of mutual diffusion of ingredients of the both parts.

Various CVD techniques have been established and are available for the formation of a diamond layer that originates from diamond particles fixed in the intermediate layer.

While hot filament techniques, in particular, are well known for preparing a uniform protective coating of diamond over a large area, other techniques based on microwave CVD or radio wave CVD are also available.

EXAMPLE 1

TC-459 (trade name?) titanium metal fine powder (a Toho Titanium Corp. product, particle size $\leq 20$ μm), amorphous boron powder and carbonyl nickel powder were mixed in a proportion by mass of 68:30:2 and subjected to a self propagating high temperature synthesis process. The resulting powder product was admixed with 1% by mass of a nominal 50 nm size diamond (MD50-OB grade; $D_{50}$ of 58 nm, $D_{10}$ of 37 nm, $D_{90}$ of 92 nm; specific surface area of 129 $m^2/g$; surface terminated with hydrogen) and further loaded in a copper tube having an outer diameter of 10 mm and a wall-thickness of 1 mm, which was then extruded to form a cylindrical electrode rod of 3.2 mm in diameter.

The electrode rod was used to form a deposition layer with an arrangement such as basically illustrated in FIG. 1. An annular plate or ring of 20% Co—WC alloy with an outer diameter (O.D.) of 75 mm, an inner diameter (I.D.) of 50 mm and a thickness of 5 mm was placed (as a base body) on and fixed to a rotary work table. The electrode was contacted with and slid over the annular plate lightly in touch at a rate of 10 mm/min, while the table was rotated at 10 r.p.m., until an about 2 μm thick layer was deposited. For the discharge process an Alier-Metal power source unit was used to supply power input, setting at a single pulse power input E of 0.3 Joule, pulse frequency f of 500 Hz, and total pulse number N of 27000.

The annular plate was used to deposit a 5 μm thick diamond layer by hot filament CVD on and over diamond particles as nuclei in the layer. The product was used as a rotary sealing element for a sand pump.

EXAMPLE 2

86% (values indicated by mass; the same applies hereinafter) of an equal molar mixture of titanium metal fine powder (a Toho Titanium product with an average particle size of 20 μm) and amorphous boron powder was mixed with 12% of copper metal powder (each powder having a particle size of 25 μm or smaller) were further admixed with 2% of nominal 20 nm size diamond (MD20-OB grade with $D_{50}$ of 23 nm, $D_{10}$ of 17 nm, $D_{90}$ of 38 nm; specific surface area 198 m$^2$/g) as surface terminated with hydrogen. The whole, as fully and intimately mixed, was kneaded with an addition of 15% of paraffin wax, extruded into a 3 mm diameter cylindrical rod, and, by firing at 700° C. in $H_2$ to an electrode of about 75% relative density.

The electrode was used to operate a process likewise to Example 1 whereby a diamond containing layer was deposited at a single pulse power input E of 0.1 J, pulse frequency f of 1000 Hz and total pulse number N of 45000 on another annular plate of Co—WC.

Then a diamond layer was formed to a thickness of 5 μm by hot filament CVD on diamond particles as nuclei. The product was used as a rotary sealing element for a sand pump.

EXAMPLE 3

Titanium metal powder (a Toho Titanium product with an average particle size of 20 μm), carbon black powder (Tokai Carbon SRF grade; average particle size of 66 nm, specific surface area of 27 m$^2$/g), and nominal 50 nm diamond powder (MD50-OB) were dosed to a mass proportion of 77:16:6, fully mixed intimately and press-formed to a cylindrical electrode of 5 mm in diameter and 50 mm in length with a relative density of 80%. With this electrode an electric spark discharge process was operated whereby a tungsten carbide alloy (13% Co—WC) conical tip of lathe center base was deposited on the conical surface with a 15 μm thick titanium carbide layer containing 2% approx. of diamond. The deposit was ground with a diamond wheel to provide a smooth surface, on which diamond was grown by hot filament CVD to a thickness of 15 μm.

EXAMPLE 4

Chromium metal powder (PKh-1, a GOST 5905-2004 product with an average particle size of 25 μm) and nominal 50 nm diamond powder (MD50-OB, Tomei Diamond product) were dosed to relative masses of 95:5. The powders were fully mixed intimately and formed to a cylindrical electrode of 5 mm in diameter and 50 mm in length with a relative density of 75%.

An electric spark discharge process was operated with an Alier-Metal power source unit whereby a lathe center conical tip base of 6% Co—WC was deposited on the surface with 25 μm thick chromium metal-chromium carbide composite layer containing 2% of diamond particles distributed in it. The deposit was lightly ground on the surface using a #400 diamond wheel to provide a smooth surface, on and over which diamond was grown by hot filament CVD to form a layer of 10 μm in thickness.

EXAMPLE 5

A consumable electrode was prepared and used, by packing a copper tube of 10 mm O.D. and 1 mm wall thickness with 5% of 50 nm diamond powder (MD50-OB with $D_{50}$ of 53 nm, $D_{10}$ of 34 nm, $D_{90}$ of 83 nm, and specific surface area of 89 m$^2$/g), 90% of equal-molar mixture of titanium metal (a Toho Titanium product with an average particle size of 20 μm) and carbon black, and 5% of 9 to 1 mixed fine powder of Al and Ni. The tube then was drawn to a cylindrical rod with a final O.D of 3.2 mm.

As a work and base body for deposition connected to an Elitron-52B (trade name?) electric spark discharge power unit was an 18 mm long conical lathe center of JIS SK-3 steel with 12 mm O.D. and 60° point angle. While rotating at 30 r.p.m. the work was deposited with a 3 μm approx. thick layer in an electric discharge operated at single pulse power input E of 1 J, pulse frequency f of 500 Hz, total pulse number N of 15000, and current of 1.0 A. The base body and deposit were firmly joined together by means of Fe—Al—Ni alloy formed by and during the process. Diamond layer was grown on the deposit thus obtained to a thickness of 10 μm by microwave CVD for use as a center of tungsten carbide roll grinder.

EXAMPLE 6

Powders of WC—F tungsten carbide (Japan New Metals product with a particle size of 0.6 μm), TC-459 titanium metal (a Toho Titanium product with an average particle size ≤20 μm) and nominal 20 nm size diamond (MD20-OB; $D_{50}$ of 23 nm, $D_{10}$ of 17 nm, $D_{90}$ of 38 nm; specific surface area of 198 m$^2$/g) as surface terminated with hydrogen, were dozed to a mass proportion of 68.1:20.2:11.6 and mixed and crushed in a planetary mill. The mixed powder was press formed into a 5 mm O.D., 50 mm long cylindrical electrode rod of relative density of 80%.

As a work and base body for deposition connected to a KPM50 electric spark discharge power unit was an 18 mm long conical lathe center of JIS SK-3 steel with 12 mm O.D. and 60° point angle. While rotating at 30 r.p.m. the work was deposited with a 3 μm approx. thick layer in an electric discharge operated at a discharge current 1.0 A. The deposit contained 2% of diamond (approx. by mass, or 6% by volume).

Diamond layer was grown on the deposit by microwave CVD to a thickness of 10 μm, for use as a center of carbide alloy cylindrical grinder.

EXAMPLE 7

A base body of carbide alloy (13% Co—WC) was coated by vapor deposition with 0.1 μm thick chromium layer, scattered over with diamond particles of an about 1 μm average particle size by spin coating, and further coated with a 1.2 μm chromium layer by vapor deposition.

The base body thus treated was heated in hydrogen at a temperature of 800° C., which was maintained 20 minutes, in order to securing a diffusion zone between the layers of tungsten carbide alloy and chromium coating. The resulting composite was lightly ground using diamond slurry of about 1 μm average particle size to expose diamond particles, on and over which diamond was deposited by hot filament CVD.

Observation in section of the resulting composite revealed some chromium carbide layer formed in the CVD process at the interface between the diamond and chromium, by means of which the chromium coating was firmly joined with the carbide alloy base body.

EXAMPLE 8

A carbide alloy (6% Co—WC) base body was deposited as an undercoating with an about 0.5 μm thick chromium nitride by vapor deposition. Nominal 50 nm size diamond particles (MD50-OB; $D_{50}$ of 53 nm, $D_{10}$ of 34 nm, $D_{90}$ of 83 nm, and specific surface area of 89 m²/g) were scattered by spin coating over the chromium surface, and then deposited with diamond layer by hot filament CVD.

Observation in section of the resulting composite revealed some chromium carbo-nitride having formed by mutual diffusion between the diamond and chromium nitride, and that the chromium coating was firmly joined with the carbide alloy base body.

EXAMPLE 9

A carbide alloy (6% Co—WC) base body was deposited on and over with an about 0.1 μm thick chromium metal layer by vapor deposition and, similarly, with chromium nitride layer on it. Then nominal 20 nm diamond particles (MD20-OB; $D_{50}$ of 23 nm, $D_{10}$ of 17 nm, $D_{90}$ of 38 nm, and specific surface area of 198 m²/g) were scattered by spin coating over the chromium nitride surface, and then deposited with diamond layer by hot filament CVD.

Observation in section of the resulting composite revealed some chromium carbo-nitride having formed by mutual diffusion between the diamond and chromium nitride, and that the chromium coating was firmly joined with the carbide alloy base body.

EXAMPLE 10

A carbide alloy (20% Co—WC) plate was deposited on and over with an about 0.5 μm thick VC layer by sputtering and then deposited with diamond particles of 0.2 μm average particle size by dipping, and further about 2 μm thick VC layer by sputtering. Then the composite was heated to a maintained temperature of 900° C. at a pressure of $10^{-4}$ Torr; in order to secure a diffusion whereby cobalt component mainly diffused from the carbide alloy into the VC coating.

The resulting composite was lightly ground using diamond slurry of about 1 μm average particle size to expose diamond particles, on and over which diamond was deposited by hot filament CVD.

EXAMPLE 11

As a spray material was used a mixed powder that was composed of 15% of 5% TiC-coated diamond particles with an average particle size of 0.5 μm, and 85% of chromium powder with an average particle size of 10 μm. The material was sprayed to deposit a diamond containing layer on a SUS316 plate, formed as a centerless grinder blade blank, with parameters shown below:

TABLE 1

| | | flow rate (liter/min.) | | | |
|---|---|---|---|---|---|
| spray distance (mm) | spray velocity (m/min.) | oxygen | propylene | air | powder carrier gas (nitrogen) |
| 200 | 10 | 40 | 40 | 30 | 60 | base body material: SUS316 steel, shot blasted.

The sprayed surface was ground with a #800 diamond wheel to expose, by removing sprayed material, diamond particles below, and by further removing the TiC coating to expose the diamond surface. The resulting composite was used for forming diamond growth layer by a hot filament CVD process.

INDUSTRIAL APPLICABILITY

The technique of the present invention excludes the effect of base body material to a diamond layer to grow thereon, so diamond coating becomes possible, sound and firmly bonded to carbide alloys and steels that contain an iron group metal, which is harmful to diamond growth. Thus the technique is effectively applicable for the deposition of a wear resistant coating on a base body of wide ranging materials.

EXPLANATION OF SYMBOLS 1 consumable electrode (anode)
2 holder
3 work table
4 work (base body)
5 deposited layer

The invention claimed is:
1. A method for the preparation of a diamond deposition surface on a base body of hard material, wherein
a matrix layer is deposited on a surface of the base body by an electric spark discharge, said matrix layer comprising a first metal selected from a first group of Si, Ti, Zr, Hf, V, Nb, Ta, Cr, Mo and W, and/or a first compound between said first metal and a non-metallic substance selected from boron, carbon and nitrogen, said matrix layer holding seed diamond particles spread in/over the matrix layer that have an average particle size of 1 μm or smaller, the deposition of the matrix layer is conducted under the effect of heat, such that a diffusion of atoms of said first metal and/or a component metal of said hard material is caused to proceed between the matrix layer and base body from one to the other in either direction and thereby a joint zone is formed to extend over said matrix layer and said base body, for joining said matrix layer and said base body to each other, and wherein
the electric discharge is operated with parameters of single pulse power input energy E, pulse current frequency f and number of total pulses in the deposition process N set and held at:

| Single pulse input energy E | $0.01 \leq E(J) \leq 10$ |
| Number of total pulses in the process N | $500 \leq N \leq 5400000$ |
| Pulse current frequency f | $0.0185 \leq f/N \leq 0.1$ |

2. The method as claimed in claim 1, wherein:
the matrix layer is formed by preparing a mixed powder by closely mixing both in pulverized form of at least a first metal selected from a first (metal) group of Si, Ti, Zr, Hf, V, Nb, Ta, Cr, Mo and W and a first compound between said first metal and a non-metallic substance selected from boron, carbon and nitrogen, and diamond particles,
press-forming said mixed powder into an electrode rod, and
applying said electric spark discharge caused to proceed over the electrode rod and the base, whereby the first metal is transferred in molten particles onto the base body surface and further converted to carbide, boride, or nitride and contained in the matrix.

3. The method as claimed in claim 1, wherein:
the forming of the matrix layer includes press-forming into an electrode rod a powder comprising at least a first metal selected from a first (metal) group of Si, Ti, Zr, Hf, V, Nb, Ta, Cr, Mo and W, and wherein
the matrix layer is formed on a surface of said base body by the electric discharge caused to proceed over the electrode rod and the base body, whereby the first metal is transferred in molten particles onto the base surface and converted to nitride by reaction with nitrogen in the atmosphere, and contained in the matrix.

4. The method as claimed in claim 2, wherein said electric spark discharge is proceeded between and over said electrode rod and said base body, whereby said powder is transferred in molten particles to the base body.

5. The method as claimed in claim 2, wherein a second metal selected from a second metal group of Al, Si and Ni is admixed intimately to said first metal, converted to an intermetallic compound by reaction with the first metal under the heat of discharge and contained in the matrix.

6. A method for the preparation of a diamond deposition surface on a base body of hard material, wherein comprised are the steps of:
(1) depositing a matrix layer on and over the base body by an electric spark discharge, said matrix layer comprising a first metal selected from a first group of Si, Ti, Zr, Hf, V, Nb, Ta, Cr, Mo and W, and a first compound between said first metal and a non-metallic substance selected from boron, carbon and nitrogen;
(2) depositing in/over said matrix layer seed diamond particles that have an average particle size of 0.1 μm or smaller in such a way that these diamond particles are spread in/over said matrix layer;
(3) securing said diamond particles in and with the matrix layer deposited;
(4) forming a joint zone to be extended over the matrix layer and base body for joining them to each other by means of conducting at least one of the steps (1)-(3) under the effect of heat such that a diffusion of atoms of said first metal and/or a component metal of said hard material of the base body is caused to proceed between the matrix layer and the base body from one or the other in either direction; and the electric discharge is operated with parameters of single pulse power input energy E, pulse current frequency f and number of total pulses in the deposition process N set and held at:

| Single pulse input energy E | $0.01 \leq E(J) \leq 10$ |
|---|---|
| Number of total pulses in the process N | $500 \leq N \leq 5400000$ |
| Pulse current frequency f | $0.0185 \leq f/N \leq 0.1$. |

7. The method as claimed in claim 2, wherein:
the matrix layer is formed by preparing a mixed powder by closely mixing both in pulverized form of at least a first metal selected from a first (metal) group of Si, Ti, Zr, Hf, V, Nb, Ta, Cr, Mo and W and a first compound between said first metal and a non-metallic substance selected from boron, carbon and nitrogen, and diamond particles, press-forming said mixed powder into an electrode rod, and
apply the electric spark discharge caused to proceed over the electrode rod and the base, whereby the first metal is transferred in molten particles onto the base body surface and further converted to carbide, boride, or nitride and contained in the matrix.

8. The method as claimed in claim 6, wherein:
the forming of the matrix layer includes press-forming into an electrode rod a powder comprising at least a first metal selected from a first (metal) group of Si, Ti, Zr, Hf, V, Nb, Ta, Cr, Mo and W, and wherein
the matrix layer is formed on a surface of said base body by the electric spark discharge caused to proceed over the electrode rod and the base body, whereby the first metal is transferred in molten particles onto the base surface and converted to nitride by reaction with nitrogen in the atmosphere, and contained in the matrix.

9. The method as claimed in claim 6, wherein said electric spark discharge is proceeded between and over said electrode rod and said base body, whereby said powder is transferred in molten particles to the base body.

10. The method as claimed in claim 9, wherein a second metal selected from a second metal group of Al, Si and Ni is admixed intimately to said first metal, converted to an intermetallic compound by reaction with the first metal under the heat of discharge and contained in the matrix.

* * * * *